United States Patent [19]
Cava

[11] Patent Number: 5,754,392
[45] Date of Patent: May 19, 1998

[54] ARTICLE COMPRISING A RELATIVELY TEMPERATURE-INSENSITIVE TA-OXIDE BASED CAPACITIVE ELEMENT

[76] Inventor: Robert Joseph Cava, 47 Leabrook La., Princeton, N.J. 08540

[21] Appl. No.: 735,170

[22] Filed: Oct. 22, 1996

[51] Int. Cl.⁶ .......................... H01G 4/06; H01G 4/008; H01G 4/10
[52] U.S. Cl. .................. 361/321.4; 361/305; 361/322
[58] Field of Search ..................... 361/301.1, 303, 361/305, 311, 312, 313, 320, 321.1, 321.2, 321.3, 321.4, 321.5, 322, 509, 512, 529; 501/134, 136; 29/25.42, 25.03

[56] References Cited

U.S. PATENT DOCUMENTS

| | | | |
|---|---|---|---|
| 4,054,531 | 10/1977 | Takahashi et al. | 501/134 |
| 4,219,866 | 8/1980 | Maher | 361/321.4 |
| 4,223,369 | 9/1980 | Burn | 361/321.4 |
| 4,812,426 | 3/1989 | Takagi et al. | 501/136 |

OTHER PUBLICATIONS

"Electrical Properties of $Al_2O_3$–$Ta_2O_5$ Composite Dielectric Thin Films Prepared by RF Reactive Sputtering", by K. Nomura, *Journal of the Electrochemical Society*, Solid-State Science And Technolgy, vol. 134, No. 4, Apr. 1987, pp. 922–925.

"Some Properties of RF Sputtered $Al_2O_3$–$Ta_2O_5$ Composite Thin Films", by K. Nomura, *J. Electrochem. Soc.*, vol. 138, No. 12, Dec. 1991, pp. 3701–3705.

*Primary Examiner*—Kristine L. Kincaid
*Assistant Examiner*—Anthony Dinkins
*Attorney, Agent, or Firm*—Eugen E. Pacher

[57] ABSTRACT

Dielectric material of nominal composition $(Al_2O_3)_x(Ta_2O_5)_{1-x}$ with $0.03<x<0.15$, unexpectedly can exhibit a relatively small temperature variation of the dielectric constant (e.g., <50 ppm/°C. at 1 MHz and 20° C.) and a relatively large value of the dielectric constant. The dielectric according to the invention advantageously is used in capacitive elements, e.g., in MOS capacitors in integrated circuits for personal communication devices.

6 Claims, 3 Drawing Sheets

ARTICLE COMPRISING A RELATIVELY TEMPERATURE-INSENSITIVE TA-OXIDE BASED CAPACITIVE ELEMENT

FIELD OF THE INVENTION

This invention pertains to Ta-oxide based capacitive elements, and to articles that comprise such an element.

BACKGROUND OF THE INVENTION

For many technological applications (e.g., for microwave frequency personal communication devices), it would be highly desirable to have available dielectric material having high dielectric constant, low loss and a small temperature coefficient of the dielectric constant, all at the relatively high frequencies of interest. Availability of such dielectric material could, inter alia, facilitate provision of relatively temperature-insensitive resonator circuits.

Presently used dielectric materials (typically based on Si-oxide) will eventually prove inadequate for use in capacitors in integrated circuits and in other capacitive elements, due to their relatively low dielectric constant. Thus, more exotic dielectric materials are under investigation.

$Ta_2O_5$ is a dielectric of special interest, as it is compatible with microelectronics manufacturing and forms good quality films under micro-electronics-compatible processing conditions. However, $Ta_2O_5$ has a relatively high temperature coefficient of the dielectric constant, and consequentially, $Ta_2O_5$-based capacitive elements would exhibit significant temperature dependence of their capacitance. By a "capacitive element" I mean a circuit element that substantially has capacitive characteristics. The term is intended to include capacitors as well as filters and resonators.

In view of the otherwise advantageous properties of $Ta_2O_5$, it would be highly desirable to have available a $Ta_2O_5$-based dielectric material having relatively low temperature coefficient of the dielectric constant. This application discloses such material.

K. Nomura et al., *J. Electrochemical Society*, Vol. 134, p. 922 (1987) report deposition of composite thin films of $Ta_2O_5$ and $Al_2O_3$, as well as some properties of the composite films. Among the properties are capacitance and dissipation factor as a function of frequency over the range 1–1000 kHz (see FIG. 5). See also K. Nomura et al., *J. Electrochemical Society*, Vol. 138, p. 3701 (1991).

SUMMARY OF THE INVENTION

I have made the unexpected discovery that there exists a relatively small compositional range in which (Ta, Al)-oxide can have substantially lower temperature dependence of the dielectric constant than does Ta-oxide. For instance, $Ta_2O_5$ has a temperature coefficient of about 250 ppm/°C. at 1 MHz and 20° C., whereas a sample of (Ta, Al)-oxide with Al/(Al+Ta) atomic ratio of about 0.054 exhibited a temperature coefficient of −5 ppm/°C. under the same conditions. This is a quite surprising result of considerable technological significance. By "(Ta, Al)-oxide" is meant herein a material consisting primarily of Ta, Al and oxygen, with Ta and Al being at least 90 (preferably at least 95) atomic % of the total metal content.

Not only can Al-oxide addition significantly reduce the temperature dependence of the dielectric constant, but such addition can also result in somewhat increased dielectric constant. Furthermore, I have also found that the dielectric constant of the material is substantially constant over the frequency range from approximately 1 kHz to 14 GHz, and that the material can have relatively low dissipation (e.g., quality factor Q of about 600 at 20° C. and 5 GHz).

In a broad aspect the invention is embodied in an article (e.g., an IC or a personal communication device) that comprises a relatively temperature insensitive capacitive element.

More specifically, the article comprises a capacitive element that comprises a dielectric material, the dielectric material comprising (Ta, Al)-oxide.

Significantly, the dielectric material has an Al/(Al+Ta) atomic ratio x in the approximate range 0.03–0.15, said ratio selected such that the dielectric material has a low (e.g., <50 ppm/°C. at 1 MHz and 20° C.) temperature coefficient of the dielectric constant.

The material can contain minor amounts of optional additives such as $TiO_2$ or other metal oxides, subject to the requirement that Ta and Al together provide at least 90 atomic % of the metal content of the material.

DETAILED DESCRIPTION

The dielectric materials that were prepared in the course of the instant investigation were bulk samples of nominal composition $(Al_2O_3)_x(Ta_2O_5)_{1-x}$, prepared by ceramic processing techniques. However, the invention is not so limited. For instance, it is anticipated that thin films of the same nominal composition will have similar dielectric properties. Such films can be prepared by a variety of conventional techniques, either deposited directly from oxide targets or by oxidation of a metal film. Among the conventional techniques are sputtering, chemical vapor deposition, laser ablation, and e-beam evaporation. It is also anticipated that dielectrics according to this invention may contain a relatively small amount of metals other than Ta and Al. For instance, it is known that addition of a small amount (e.g., 8%) of $TiO_2$ to $Ta_2O_5$ can result in a significant increased dielectric constant. Thus, the presence of $TiO_2$, or other optional property improving constituents in dielectrics according to the invention is anticipated.

Ceramic disks of nominal composition $(Al_2O_3)_x(Ta_2O_5)_{1-x}$ were made by mixing high purity $Ta_2O_5$ (99.993%) and $Al_2O_3$ (99.99%) in the desired molar amounts, heating the mixture in air at 1350° C. for 60 hours, followed by mechanical grinding. The resultant powder was then heated to 1400° C. for 10 hours, ground a second time, and pressed into half inch diameter pellets approximately 3 mm thick. The pressed pellets were placed on dense $Al_2O_3$ plates on powders of their own composition, and densified by firing for 2 hours in air a temperatures between 1575° C. and 1625° C. The resulting pellets were greater than 90% of theoretical density. The above described process of making the (Al, Ta)-oxide is exemplary, and those skilled in the art will be able to adapt the process to their particular circumstances.

Powder X-ray diffraction showed the thus produced materials to be a $Ta_2O_5$-type solid solution for x in the range 0–0.075, and to be multi-phase materials consisting of the high alumina-content $Ta_2O_5$-type solid solution phase plus $AlTaO_4$ for x in the range 0.075–0.20. Those skilled in the art will appreciate that the notation $(Al_2O_3)_x(Ta_2O_5)_{1-x}$ indicates the starting compositions (also referred to as the "nominal" composition) and does not necessarily imply the presence of the two oxides in the exact indicated ratio in the final product.

Electrical contact was made to the thus produced ceramic pellets by coating the plane surfaces of the pellets with 50:50 Ga-In alloy solder. A commercially available impedance analyzer was used to measure the dielectric constant (K) and dissipation factor (D; also designated "tan δ" and "1/Q") between 1 kHz and 5 MHz, with an applied field of about 5 V/cm, over the temperature range –40° C. to 100° C.

Figure 1:
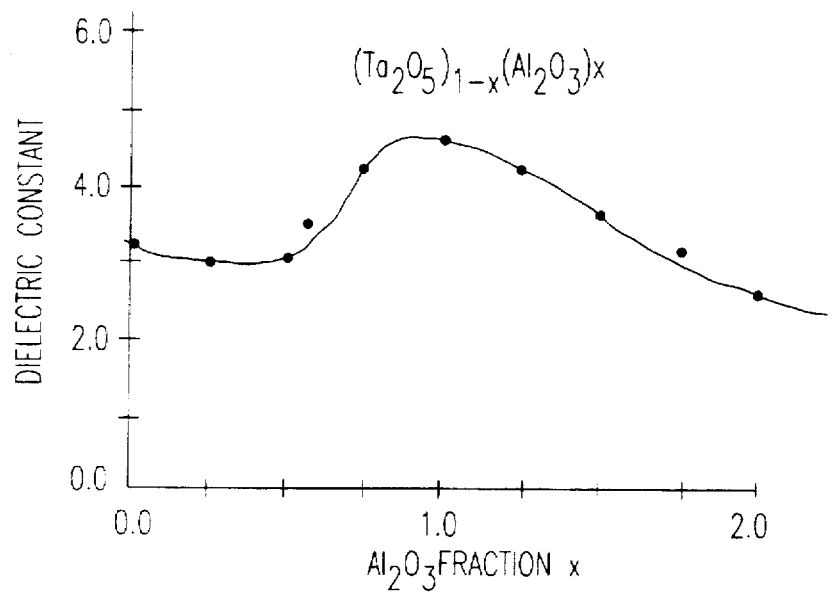
FIG. 1 shows exemplary data on dielectric constant vs. Al/(Al+Ta) ratio x.

FIG. 1 shows the dielectric constant at 1 MHz and 20° C. of exemplary material of nominal composition $(Al_2O_3)_x(Ta_2O_5)_{1-x}$, for x in the range 0–0.20.

Figure 2:
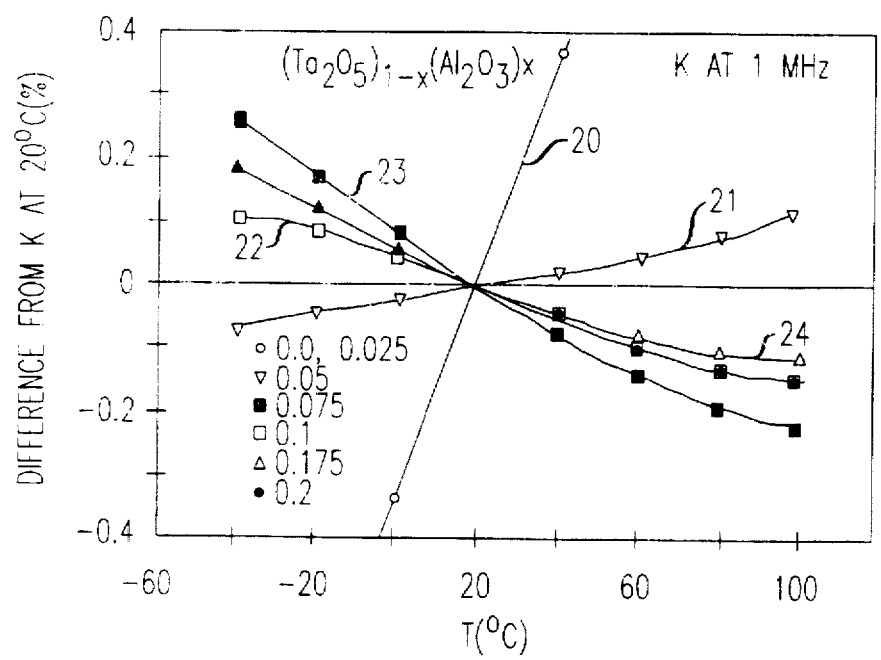
FIG. 2 shows exemplary data on the temperature dependence of the dielectric constant, as a function of x.

FIG. 2 shows data on the temperature dependence of the dielectric constant for various exemplary samples. Curve 20 pertains to x=0 and 0.025, and curves 21–24 pertain to x=0.05, 0.075, 0.1 and 0.175, respectively. The curve for x=0.2 substantially coincides with the curve for x=0.175 for temperatures below about 20° C., and substantially coincides with the curve for x=0.075 for temperatures above about 20° C. The enormous difference in temperature dependence of the dielectric constant for x=0 (and 0.025) and for x>0.03 is immediately apparent from FIG. 2.

Figure 3:
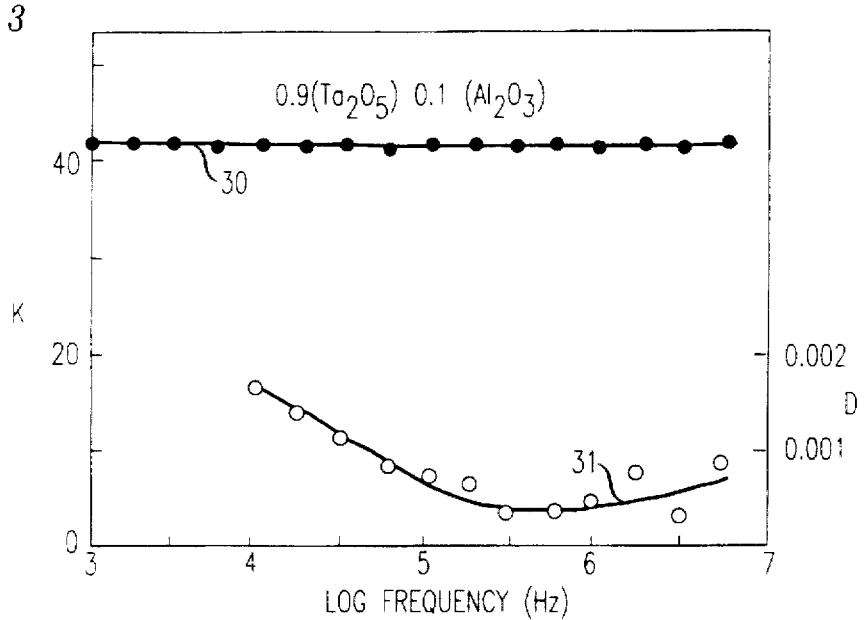
FIG. 3 shows exemplary data on the frequency dependence of dielectric constant and dissipation factor, of an exemplary composition according to the invention.
Figure 3A:
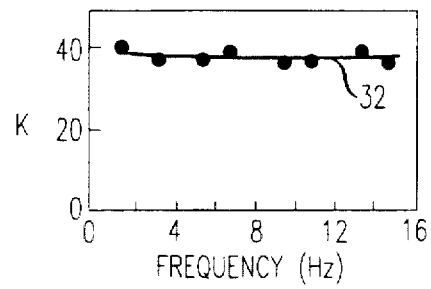

FIG. 3 shows data on dielectric constant and dissipation factor at 20° C. as a function of frequency, for an exemplary sample having x=0.1. Curve 30 shows K over the range 1 kHz–5 MHz, curve 31 shows D over the approximate range 10 kHz–5 MHz, and curve 32 shows K over the range 1–14 GHz.

Figure 4:
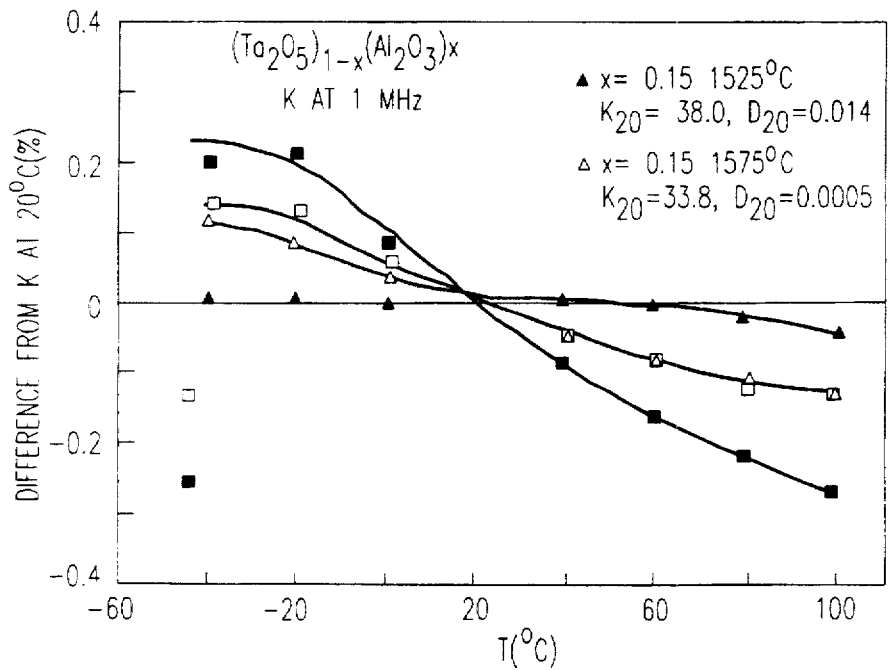
FIG. 4 shows further data on the temperature dependence of the dielectric constant and dissipation factor.

FIG. 4 illustrates the observation that the details of the temperature dependence of the dielectric properties of materials according to the invention depend somewhat on preparatory conditions. Curves 40 and 41 pertain to a sample having x=0.15, with the former curve pertaining to the sample after sintering for 2 hours at 1525° C., and the latter curve to the same sample after 4 additional hours at 1575° C. Curves 42 and 43 pertain to a sample having x=0.056, with the former curve pertaining to the sample after sintering at 1625° C., and the latter curve to the same sample after an additional 5 hour anneal at 1100° C. FIG. 4 also shows the values of K at 20° C. ($K_{20}$) and of D at 20° C. ($D_{20}$), for the same samples and treatment conditions.

The exemplary data of FIG. 4 clearly illustrates the dependence of the dielectric properties of the material according to the invention on treatment details, and suggests the possibility of tailoring of the dielectric properties for various applications.

Table 1 presents a summary of the dielectric properties as a function of nominal composition. Inspection of the data shows a moderate enhancement of the observed dielectric constants over that of $Ta_2O_5$ for all temperatures, for x in the range of approximately $0.06 \leq x < 0.15$. The exact value of the dielectric constant observed was found to vary somewhat (~±5 to 10%) from preparation to preparation, possibly due to differences in pellet density and preferred orientation of ceramic grains, but the general observation of moderate K enhancement was consistently observed. The materials also consistently show low D values, and consequently, high Q's. The D's are also found to be somewhat variable, dependent on sample preparation conditions. The low D values in the table (0.0002–0.0005, Q=5000–2000), can be considered an upper limit for the intrinsic losses of these materials at MHz frequencies, since the measured values have not been corrected for contributions from the measurement circuit. These materials therefore can be high quality dielectrics in this frequency range investigated, and possibly even beyond that range.

TABLE 1

Dielectric Properties of Representative $(Ta_2O_5)_{1-x}(Al_2O_3)_x$ Polycrystalline Ceramics at 1 MHz

| | –20° C. | | 20° C. | | 60° C. | | 100° C. | |
|---|---|---|---|---|---|---|---|---|
| x | K | D | K | D | K | D | K | D |
| 0.0 | 32.85 | 0.0023 | 33.08 | 0.0010 | 33.31 | 0.0007 | 33.56 | 0.0019 |
| 0.025 | 29.79 | 0.0028 | 30.25 | 0.0019 | 30.58 | 0.0029 | 30.75 | 0.0034 |
| 0.05 | 30.37 | 0.0003 | 30.39 | 0.0003 | 30.40 | 0.0007 | 30.42 | 0.0011 |
| 0.054 | 34.28 | 0.0002 | 34.27 | 0.0002 | 34.26 | 0.0007 | 34.26 | 0.0012 |
| 0.056 | 39.50 | 0.0002 | 39.45 | 0.0002 | 39.41 | 0.0007 | 39.39 | 0.0013 |
| 0.06 | 37.34 | 0.0003 | 37.28 | 0.0004 | 37.23 | 0.0009 | 37.19 | 0.1115 |
| 0.075 | 40.03 | 0.0005 | 39.99 | 0.0005 | 39.96 | 0.1110 | 39.93 | 0.0016 |
| 0.10 | 41.74 | 0.0003 | 41.67 | 0.0004 | 41.61 | 0.0009 | 41.58 | 0.0015 |
| 0.125 | 37.15 | 0.0003 | 37.10 | 0.0004 | 37.06 | 0.0008 | 37.04 | 0.0014 |
| 0.15 | 33.80 | 0.0006 | 33.77 | 0.0005 | 33.74 | 0.0008 | 33.72 | 0.0013 |
| 0.175 | 29.22 | 0.0003 | 29.19 | 0.0003 | 29.16 | 0.0007 | 29.15 | 0.0012 |
| 0.20 | 25.02 | 0.0002 | 24.99 | 0.0002 | 24.98 | 0.0006 | 24.98 | 0.1110 |
| 0.20 | 25.02 | 0.0002 | 24.99 | 0.0002 | 24.98 | 0.0006 | 24.98 | 0.0010 |

Table 2 shows the dielectric constant K and the temperature coefficient of K (TCK), for exemplary samples (x=0 to x=0.2). TCK is defined to be $\{(K_{100}-K_{-40})/K_{20}\}/140°$ C., where $K_{100}$, $K_{-40}$ and $K_{20}$ are K at 100° C., –40° C. and 20° C., respectively

TABLE 2

Temperature Coefficient of Dielectric Constant (TCK) at 1 MHz for Representative Polycrystalline Samples of $(Ta_2O_5)_{1-x}(Al_2O_3)_x$

| x | $K_{20}$ | TCK (ppm/°C.) |
|---|---|---|
| 0.0 | 33.08 | +250 |
| 0.025 | 30.25 | +270 |
| 0.05 | 30.39 | +13 |
| 0.054 | 34.27 | –5 |
| 0.056 | 39.50 | –20 |
| 0.06 | 37.28 | –33 |
| 0.075 | 39.99 | –19 |
| 0.10 | 41.67 | –42 |
| 0.125 | 37.10 | –25 |
| 0.15 | 33.77 | –19 |
| 0.175 | 29.19 | –30 |
| 0.20 | 24.99 | –21 |

As can be readily seen from Table 2, TCK changes from a relatively large positive value (e.g., about 250 ppm/°C.) at zero or small (e.g., ~0.025) x to a relatively small value (e.g., about 20 ppm/°C.) at higher values of x. Materials near x=0.05–0.06 have especially low TCK, with TCK typically changing sign in that range.

Considering the relevant properties in their totality, it will be seen that compositions with x in the approximate range 0.03–0.15 have advantageous properties. This is an unexpected result that is, to the best of my knowledge, not suggested by the prior art, and material according to the invention, with composition in the cited range, can advantageously be used in many articles that comprise a capacitive element (e.g., a discrete or integrated capacitor, filter, resonator, microelectronic memories comprising integrated capacitors), especially in such articles that are intended to operate over a wide temperature range.

Figure 5:
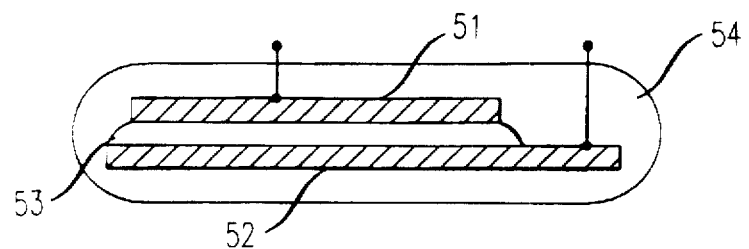
FIGS. 5 to 7 schematically depict capacitive elements according to the invention.

FIG. 5 schematically depicts an exemplary capacitive element 50 according to the invention, namely a discrete capacitor, wherein numerals 51–54 respectively refer to an upper electrode, lower electrode, dielectric according to the invention, and encapsulant. Except for the novel dielectric, the capacitor 50 can be conventional.

Figure 6:
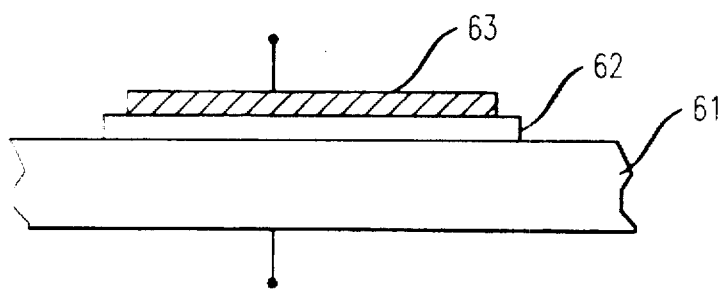

FIG. 6 schematically shows a further capacitive element according to the invention, namely, an integrated MOS capacitor 60, wherein numerals 61–63 respectively refer to a (typically doped) semiconductor substrate, dielectric layer according to the invention, and electrode. Except for the novel dielectric, the capacitor 60 can be conventional.

Figure 7:
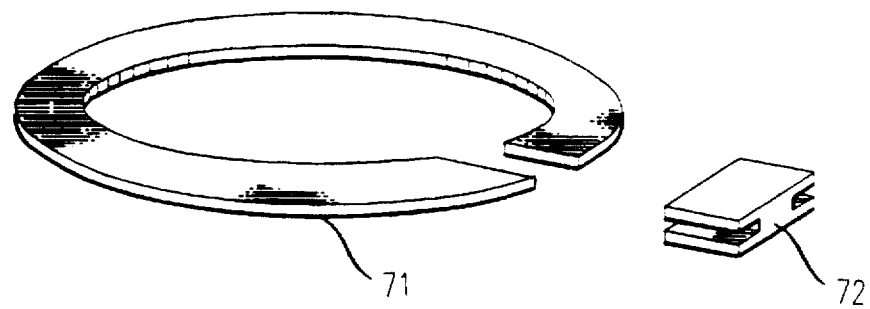

FIG. 7 schematically depicts a further capacitive element 70 according to the invention, namely, a split ring resonator 71, with dielectric member 72 to be disposed within the slot or gap of the resonator. Split ring resonators are known. Member 72 consists of dielectric material according to the invention, resulting in increased capacitance and temperature stability. A multiplicity of resonators can be assembled into a filter, as is known to those skilled in the art.

Discrete and integrated capacitors according to the invention advantageously are used in, e.g., personal communication devices, and resonators and filters according to the invention exemplarily are used in base stations or repeaters of wireless communication systems.

The invention claimed is:

1. An article comprising a capacitive element comprising a dielectric material, said dielectric material having a dielectric constant and a temperature coefficient of the dielectric constant and comprising (Ta,Al) oxide;

characterized in that said dielectric material has an Al/(Al+Ta) atomic ratio in the approximate range 0.03–0.15, said ratio selected such that said dielectric material has an absolute value of the temperature coefficient of the dielectric constant less than 50 ppm/°C. at 1 MHz and 20° C., with Al and Ta together providing at least 90 atomic % of the total metal content of the dielectric material.

2. Article according to claim 1, wherein said ratio is selected such that said temperature coefficient has an absolute value <20 ppm/°C. at 1 MHz and 20° C.

3. Article according to claim 1, wherein Al and Ta provide at least 95 atomic % of the total metal content.

4. Article according to claim 3, wherein Al and Ta provide all of the metal content.

5. Article according to claim 1, wherein the capacitive element is a capacitor comprising a first and a second conductive member, with a layer of said dielectric material disposed between the conductive members.

6. Article according to claim 1, wherein the capacitive element is a gapped resonator element, with a dielectric member disposed within the gap, said dielectric member consisting of said dielectric material.

* * * * *